US012808930B2

(12) United States Patent
Sherman

(10) Patent No.: US 12,808,930 B2
(45) Date of Patent: Nov. 24, 2026

(54) MAGNETICALLY RETAINED REPLACEABLE CONTACT PLATE FOR SEMICONDUCTOR HANDLER

(71) Applicant: ADVANTEST CORPORATION, Tokyo (JP)

(72) Inventor: Patrick Sherman, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 268 days.

(21) Appl. No.: 18/379,085

(22) Filed: Oct. 11, 2023

(65) Prior Publication Data

US 2024/0210468 A1 Jun. 27, 2024

Related U.S. Application Data

(60) Provisional application No. 63/435,521, filed on Dec. 27, 2022.

(51) Int. Cl.
*G01R 31/28* (2006.01)
*H01F 1/055* (2006.01)

(52) U.S. Cl.
CPC ......... *G01R 31/2893* (2013.01); *H01F 1/055* (2013.01)

(58) Field of Classification Search
None
See application file for complete search history.

(56) References Cited

U.S. PATENT DOCUMENTS 5,227,717 A * 7/1993 Tsurishima .............. G01R 1/04 324/756.05
6,099,597 A * 8/2000 Yap ...................... G01R 1/0408 438/18
10,338,099 B2 * 7/2019 Del Barga ........... G01R 1/0466
10,962,590 B2 * 3/2021 Yam ........................ G11C 11/16
2011/0254945 A1 * 10/2011 Kikuchi ............. G01R 31/2893 324/750.16
2012/0242333 A1 * 9/2012 Eshold ............... G01R 31/2829 324/228
2015/0276860 A1 * 10/2015 Aizawa ............. G01R 31/2887 324/750.25
2018/0294244 A1 10/2018 Onozawa et al.
2019/0302178 A1 10/2019 Saito
2021/0194601 A1 6/2021 Shiota et al.
2022/0128597 A1 4/2022 Mckenna et al.
2022/0137092 A1 5/2022 Ranganathan et al.

FOREIGN PATENT DOCUMENTS

KR 20140128517 A 11/2014
KR 101556143 B1 * 10/2015 ....... G01R 31/31718
KR 101588809 B1 1/2016
TW M607262 U 2/2021

* cited by examiner

*Primary Examiner* — Richard Isla

(57) ABSTRACT

A magnetically retained replaceable and/or removable contact plate assembly includes a contact chuck interface. The contact chuck is configured to physically mate with a device under test (DUT). The magnetically retained replaceable contact plate assembly also includes a DUT layout unit (DLU) interface. The DLU is configured to couple to multiple magnetically retained replaceable contact plate assemblies and to a semiconductor handler unit. The DLU is configured to position DUTs within a test environment. The magnetically retained replaceable contact plate assembly is configured to magnetically attach to the DLU.

9 Claims, 9 Drawing Sheets

MAGNETICALLY RETAINED REPLACEABLE CONTACT PLATE FOR SEMICONDUCTOR HANDLER

RELATED APPLICATIONS

This application claims benefit of, and priority to U.S. Provisional Application Ser. No. 63/435,521 filed Dec. 27, 2022 to Sherman, which is hereby incorporated herein by reference in its entirety.

FIELD OF INVENTION

Embodiments of the present invention relate to the field of integrated circuit manufacturing and testing. More specifically, embodiments of the present invention relate to systems and methods for testing integrated circuit products utilizing automated robotic transport and handling mechanisms including pick-and-place and/or pick-and-hold machines and/or robots.

BACKGROUND

It is common to subject integrated circuits, either packaged or unpackaged, to environmental and electronic testing as an operation in a manufacturing processes. Typically in such testing, the integrated circuit devices are subject to electrical testing, e.g., "test patterns," to confirm functionality while contemporaneously being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber or other tester. The environmental chamber would heat and/or cool the integrated circuit(s) under test, known as or referred to as a device under test, or "DUT," as well as subject the test interface and support hardware, to the desired test temperature.

Some testing systems employ automated robot handlers to move the integrated circuits from a source "tray" or "plate" to the tester and test environment. Some devices and/or tests require positive pressure or force to be applied to a DUT during testing. For example, some package types, e.g., ball grid arrays (BGA), may not make reliable contact without a force applied to ensure contact between the balls and contacts of a test apparatus. At other times, a heater and/or heat sink may be held against a DUT during testing. For such testing, it is common to utilize a "contact chuck." A contact chuck may also be known as a "pick and place chuck," a "handler chuck," a "device chuck," and/or a "pick and hold chuck." A "contact chuck" or a "pick and hold chuck" is utilized to move a DUT from a source "tray" or "plate" to the tester and test environment, and to hold the DUT in place during testing.

A contact chuck may be attached to or supported by a "contact plate." A "contact plate" is attached to or supported within a semiconductor "handler," which is used to transport, test and sort semiconductor assemblies, e.g., bare chips or dice, packaged semiconductors, and/or multi-chip assemblies. A contact plate acts as a stopper plate for the contact chuck when a device under test (DUT) is plunged into contactor, so that the device does not get over-compressed in a contactor and/or socket. Contact plates may also be known as, or referred to as a hardstop plate, a stopper plate, a chuck spacer plate, and/or a chuck interface plate.

Contact plates may accommodate a range of contact chucks, e.g., one contact plate may be used for different contact chucks of the same package type, e.g., ball grid arrays (BGAs). However, contact plates still need to be changed frequently when swapping change kits, especially when the number of test sites change, when the pitch of test sites changes, and/or when changing between different types of devices, e.g., BGA vs. quad flat no-lead (QFN) package, under test.

Anytime contact plates need to be changed, there is significant downtime incurred for the replacement. Downtime is lost money for the customer since the handler is not cycling and testing the devices. Under the conventional art, for example, each contact plate is mounted with 4 screws. For a by-16 test configuration there are eight contact plates, meaning 32 fasteners that must be unfastened by a technician, and then refastened after the contact plate is changed.

FIG. 1 shows a conventional contact plate assembly 10. Assembly 10 comprises four fasteners, e.g., bolts, 11 to secure the assembly 10 to a handler (not shown) for movement in the X, Y, and Z dimensions. The contact plate may comprise multiple alignment holes 12. The assembly 10 is typically oriented downward. For example, a DUT, in a contact chuck (not shown), would be located below assembly 10 in the view of FIG. 1.

FIGS. 2A and 2B illustrate a conventional contact plate assembly 10 in conjunction with a DUT layout unit ("DLU") 20 and a pair of contact chucks (30). The contact plate assembly 10 is sandwiched between the DUT layout unit ("DLU") 20 and a pair of contact chucks (30). The contact plate assembly 10 couples the DLU to the contact chucks.

The contact chuck assembly 10 is typically specific to a DUT and/or type of DUT. Accordingly, the assembly 10 is typically changed for each type of DUT to be tested. For a test setup configured to test 16 DUTs, 32 fasteners 11 are utilized. Thus, a changeover from a test system for a first DUT to test a second DUT requires removal of 32 fasteners 11, and insertions of 32 fasteners 11 in order to replace the contact plate.

SUMMARY OF THE INVENTION

Accordingly, what is needed is a contact plate assembly that may be attached and removed from a DUT layout unit (DLU) without the use of tools.

Embodiments of the present invention provide a magnetically retained replaceable contact plate assembly includes a contact chuck interface. The contact chuck is configured to physically mate with a device under test (DUT). The magnetically retained replaceable contact plate assembly also includes a DUT layout unit (DLU) interface. The DLU is configured to couple to multiple magnetically retained replaceable contact plate assemblies and to a semiconductor handler unit. The DLU is configured to move DUTs within a test environment. The magnetically retained replaceable contact plate assembly is configured to magnetically attach to the DLU.

In accordance with a first embodiment of the present invention, a contact chuck interface configured to physically mate with a device under test (DUT), a DUT layout unit (DLU) interface is configured to couple to a DLU, and a plurality of magnets retained within the contact plate assembly configured to magnetically attach to the DLU.

Embodiments include the above and further include wherein the plurality of magnets are further configured to align with a corresponding plurality of magnets of the DLU.

Embodiments include the above and further include a hard stop plate configured to limit travel of the contact plate assembly in a direction toward the DUT.

In accordance with another embodiment of the present invention, a contact chuck interface configured to physically mate with a device under test (DUT), and a DUT layout unit (DLU) interface, wherein the DLU is configured to couple to multiple the magnetically retained replaceable contact plate assemblies and to a semiconductor handler unit, and wherein the DLU is configured to position the DUT within a test environment, and wherein the magnetically retained replaceable contact plate assembly is configured to magnetically attach to the DLU.

Embodiments of the present invention include the above and wherein the magnetically retained replaceable contact plate assembly further comprises a vacuum port configured to pass a vacuum from the DLU to the contact chuck for retention of the DUT.

Embodiments of the present invention include the above and wherein the magnetically retained replaceable contact plate assembly is further configured to provide compliance between positioning of the contact chuck to the DLU.

Embodiments of the present invention include the above and wherein the magnetically retained replaceable contact plate assembly is further configured to conduct thermal energy from the contact chuck to the DLU.

Embodiments of the present invention include the above and wherein the magnetically retained replaceable contact plate assembly is further configured to be attached to the DLU without use of tools.

Embodiments of the present invention include the above and wherein the magnetically retained replaceable contact plate assembly is further configured to apply a force to the contact chuck to retain the DUT in a socket.

In accordance with another embodiment of the present invention, a tester system for testing integrated circuit devices under test (DUTs) includes a computerized tester for applying test vectors to the DUTs and for analyzing results therefrom. The tester system also includes an automated robotic handler for automatically moving the DUTs to the tester from a source tray, a contact chuck operable to attach to and pick up a DUT of the DUTs from the source tray, and a magnetically retained replaceable contact plate assembly configured to securely couple to the contact chuck. The magnetically retained replaceable contact plate assembly is configured to magnetically couple to the automated robotic handler.

Embodiments of the present invention include the above and wherein the contact chuck is configured to utilize a vacuum provided by the automated robotic handler through the magnetically retained replaceable contact plate assembly to retain the DUT.

Embodiments of the present invention include the above and further include wherein the contact chuck comprises a plurality of magnets configured to magnetically couple to the contact plate assembly.

Embodiments of the present invention include the above and further include wherein the magnets comprise samarium cobalt.

Embodiments of the present invention include the above and further include wherein the contact chuck comprises a plurality of magnets configured to securely couple to the plurality of magnets of the contact plate assembly.

Embodiments of the present invention include the above and further include wherein the contact chuck comprises a magnetic material configured be attracted to the plurality of magnets of the contact plate assembly.

Embodiments of the present invention include the above and further include wherein the contact chuck comprises a plurality of alignment holes configured to accept matching protrusions of the contact plate assembly for alignment of the contact chuck and the contact plate assembly.

In accordance with a further embodiment of the present invention a magnetically retained and removable contact chuck assembly includes a contact chuck interface configured to physically mate with a device under test (DUT), a magnetic contact plate interface configured to physically mate with a magnetic contact plate and a plurality of magnets retained within the contact chuck assembly configured to magnetically attach to the magnetic contact plate.

Embodiments of the present invention include the above and further include wherein the plurality of magnets are further configured to align with a corresponding plurality of magnets of the magnetic contact plate.

Embodiments of the present invention include the above and further include wherein the contact chuck assembly is configured to conduct thermal energy from the DUT to the magnetic contact plate.

Embodiments of the present invention include the above and further include wherein the contact chuck assembly is configured to be attached to the magnetic contact plate without use of tools.

BRIEF DESCRIPTION OF THE DRAWINGS

FIG. 6 illustrates a tester assembly, in accordance with embodiments of the present invention.

Figure 1:
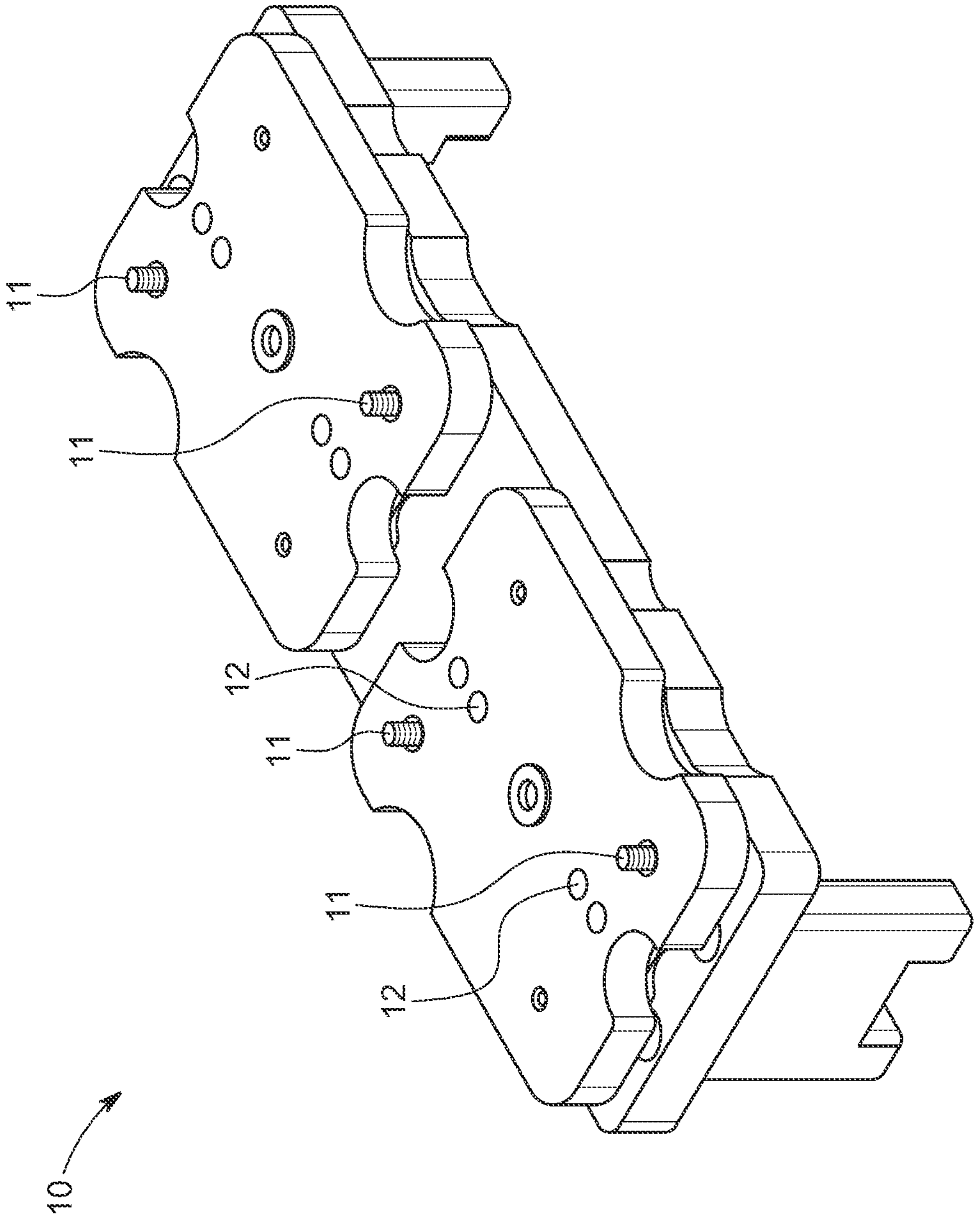
FIG. 1 shows a conventional contact plate assembly.
Figure 2A:
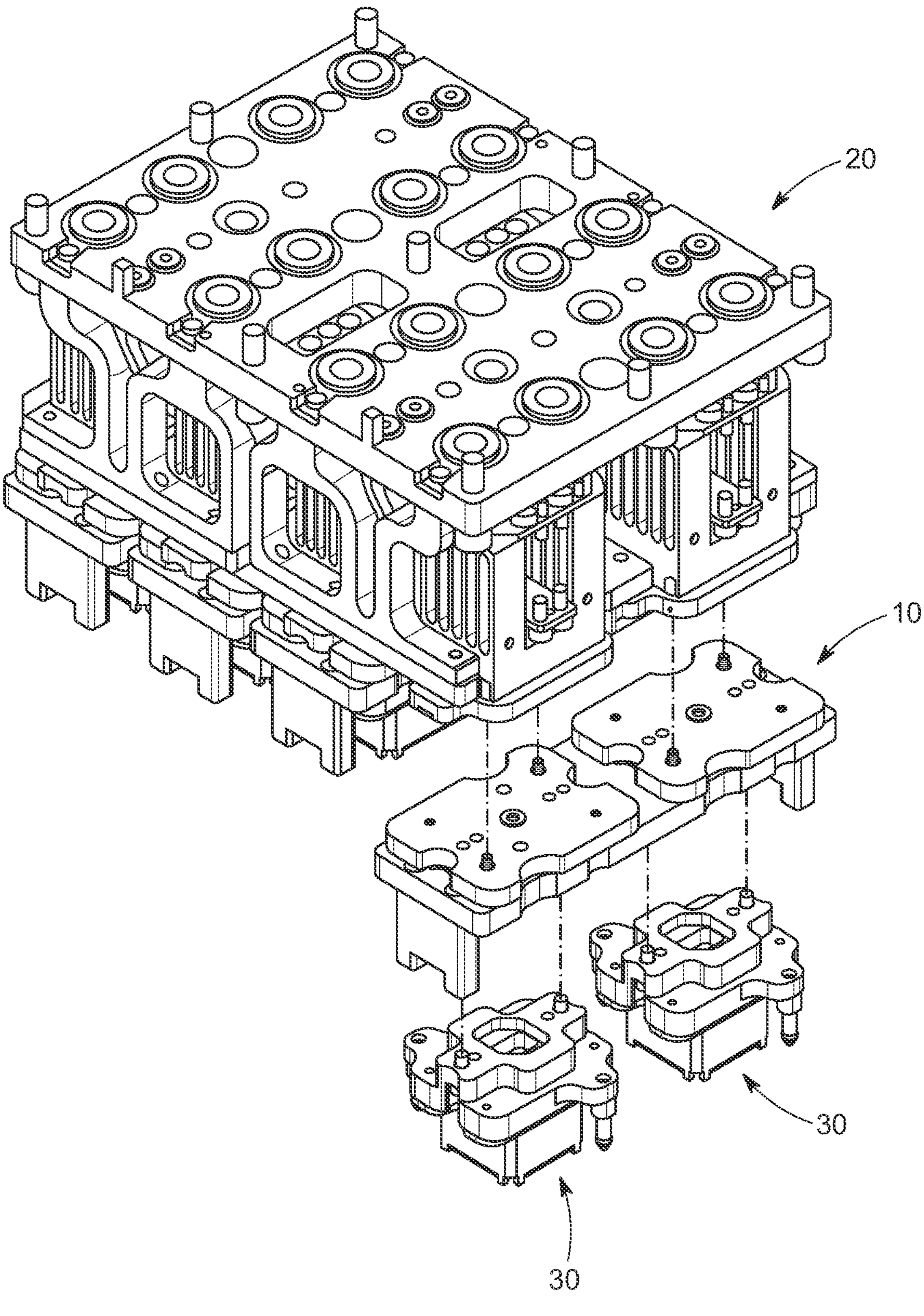
FIGS. 2A and 2B illustrate a conventional contact plate assembly in conjunction with a DUT layout unit ("DLU") and a pair of contact chucks.
Figure 2B:
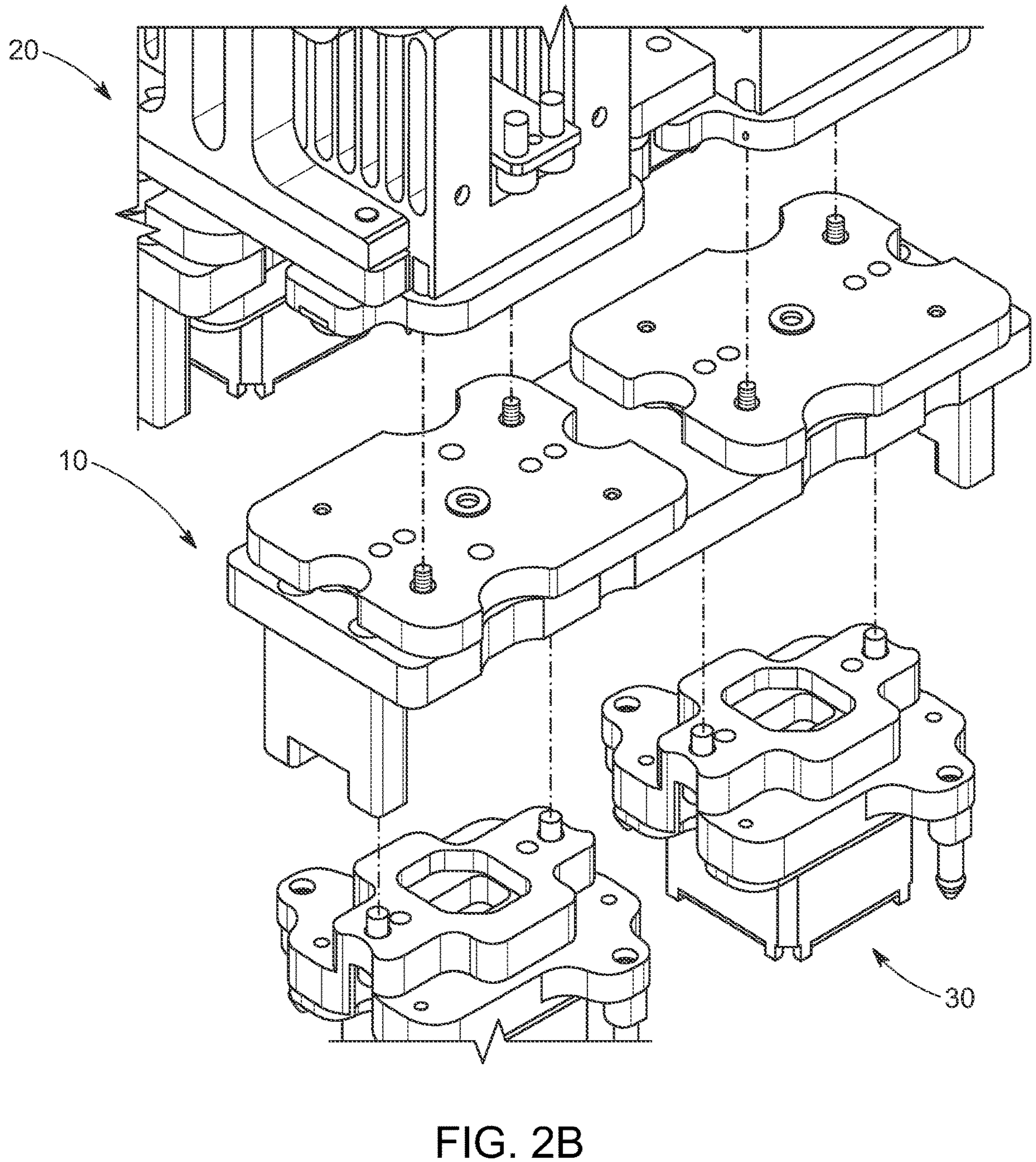

The accompanying drawings, which are incorporated in and form a part of this specification, illustrate embodiments of the invention and, together with the description, serve to explain the principles of the invention. Unless otherwise noted, dimensions are exemplary and the drawings may not be drawn to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing" or "heating" or "maintaining temperature" or "bringing" or "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in *In re Nuijten,* 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

Magnetically Retained Replaceable Contact Plate for Semiconductor Handler

Figure 3:
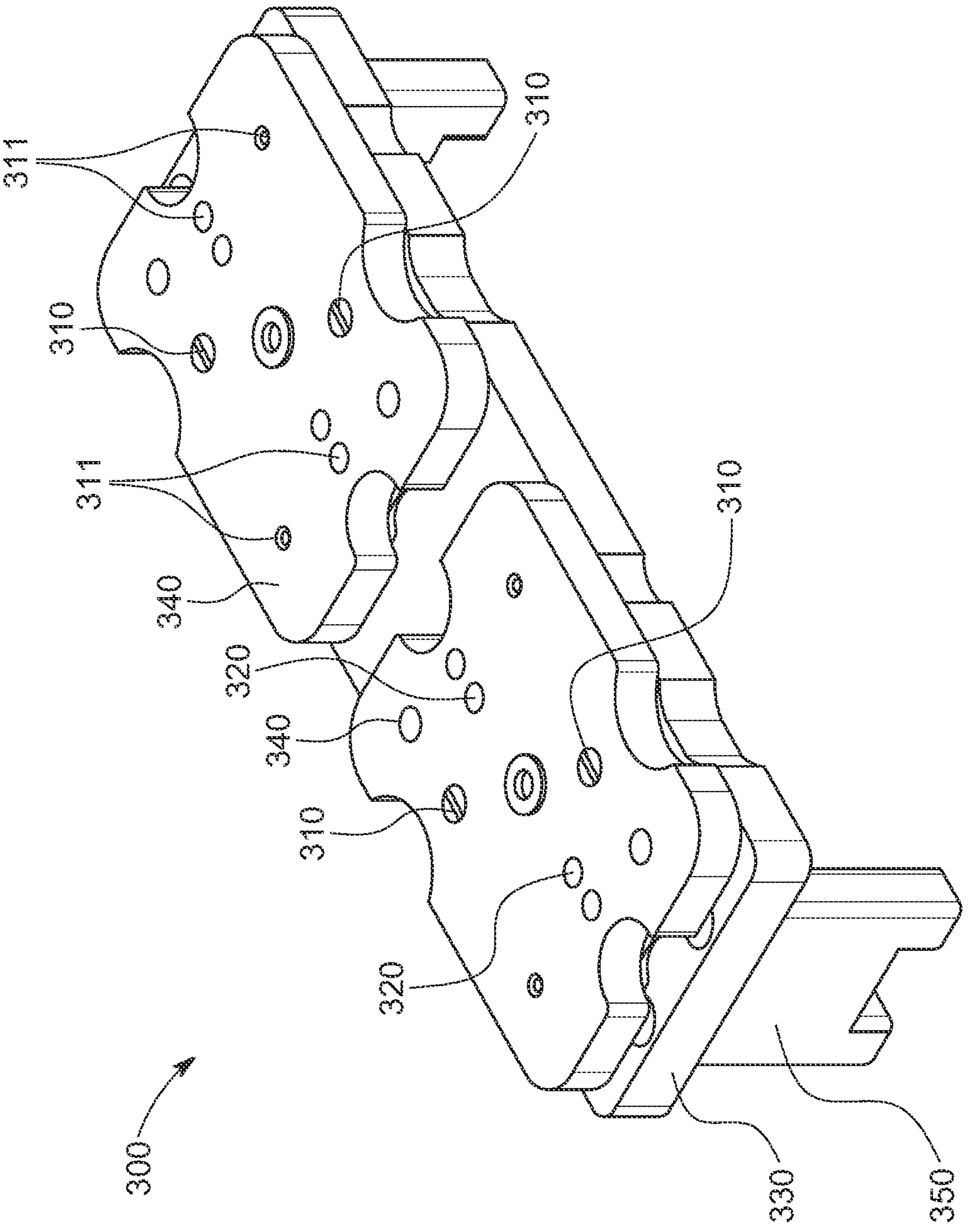
FIG. 3 illustrates an exemplary embodiment of magnetically retained replaceable contact plate assembly, in accordance with embodiments of the present invention.

FIG. 3 illustrates an exemplary embodiment of magnetically retained replaceable contact plate assembly 300, in accordance with embodiments of the present invention. The magnetically retained replaceable contact plate assembly 300 is configured to couple and/or retain a contact chuck to a DUT layout unit. Typically, a robotic handler moves the test head in X, Y, and Z directions to place a test head over a device under test ("DUT"). A plurality of magnets 310 installed on contact plate assembly 300 replace the function of conventional fasteners 11 (FIG. 1) to attach the contact plate assembly 300 to a handler (not shown). For example, a DUT (not shown) would be located within DUT interface, obscured in this view.

In some embodiments, the magnets 310 are aligned with a common pole, e.g., a magnetic north pole, facing up. Corresponding magnets in a DUT layout unit, e.g., DLU 420 (FIG. 4A), if present, may have an opposite magnetic pole, e.g., a south pole, facing the magnets 310 of contact plate assembly 300.

In some embodiments, magnetically retained replaceable contact plate assembly 300 may comprise a contact chuck alignment plate or hard stop plate 330 and a plurality of contact chuck mounting plates 340. The hard stop plate 330 may be mechanically fastened to the contact chuck mounting plates 340, e.g., with bolts. Magnetically retained replaceable contact plate assembly 300 may comprise a stopper structure 350, in some embodiments. Stopper structure 350 may be a part of, or attached to hard stop plate 330, in embodiments. Stopper structure 350 is configured to limit motion of magnetically retained replaceable contact plate assembly 300, contact chuck(s) 430 (FIG. 4A) and/or a device under test, such that the contact chuck(s) 430 and/or a device under test do not damage, and are not damaged, by excessive "downward" travel, e.g., into a socket. The shape of stopper structure 350 is exemplary. Stopper structure 350 may comprise one or more isolated pegs, for example.

The number of magnets 310 illustrated is exemplary. Note that the magnets 310 may not be located in the same position(s) as the fasteners 11. Rather, in some embodiments, the magnets 310 are located in different positions on the contact chuck assembly 300 relative to the locations fasteners 11 in assembly 10 (FIG. 1). The holes 311 correspond to fasteners 11 of assembly 10 and are present to ensure reverse compatibility with assembly 10 (FIG. 1). For example, the holes 311 may be sized to accommodate fasteners without engaging the fasteners, e.g., without screwing in bolts. The contact plate assembly 300 also includes a plurality of alignment holes 320 to accept dowels and/or pins to align with a handler assembly.

In accordance with embodiments of the present invention, the magnets 310 may align with corresponding magnets (opposite poles) of a handler assembly (not shown). In some embodiments, the handler assembly may not include such magnets. For example, the handler assembly may be formed from magnetic materials which are attracted by the magnets 310. In some embodiments, samarium cobalt magnets may be used. Samarium cobalt magnets perform well under a wide range of temperatures, e.g., −200° C. through +250° C., without degradation and are also characterized as having excellent corrosion resistance.

Figure 4A:
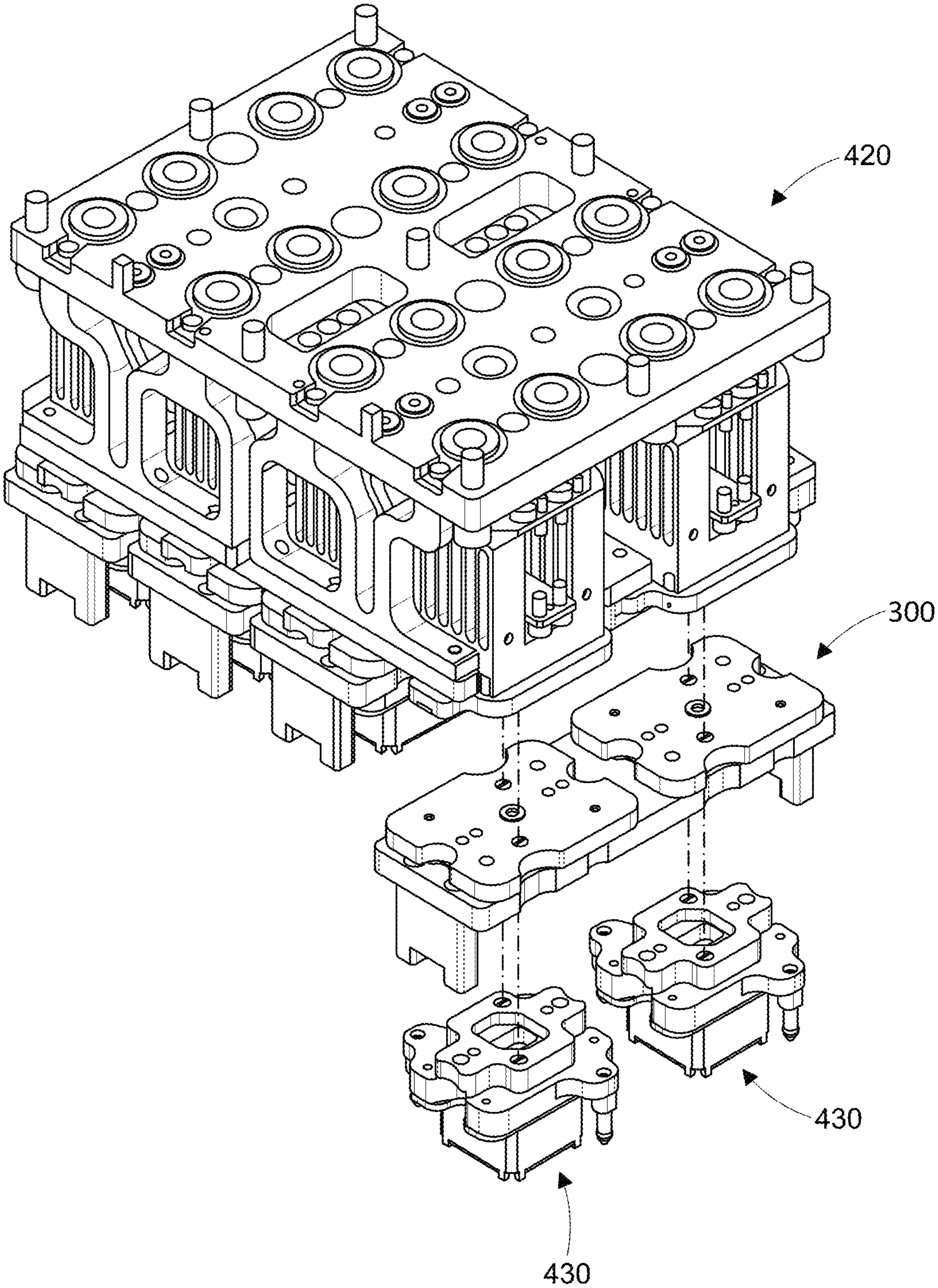
FIGS. 4A and 4B illustrate top isometric views of magnetically retained replaceable contact plate assembly in conjunction with a DUT layout unit ("DLU") and a pair of contact chucks, in accordance with embodiments of the present invention.
Figure 4B:
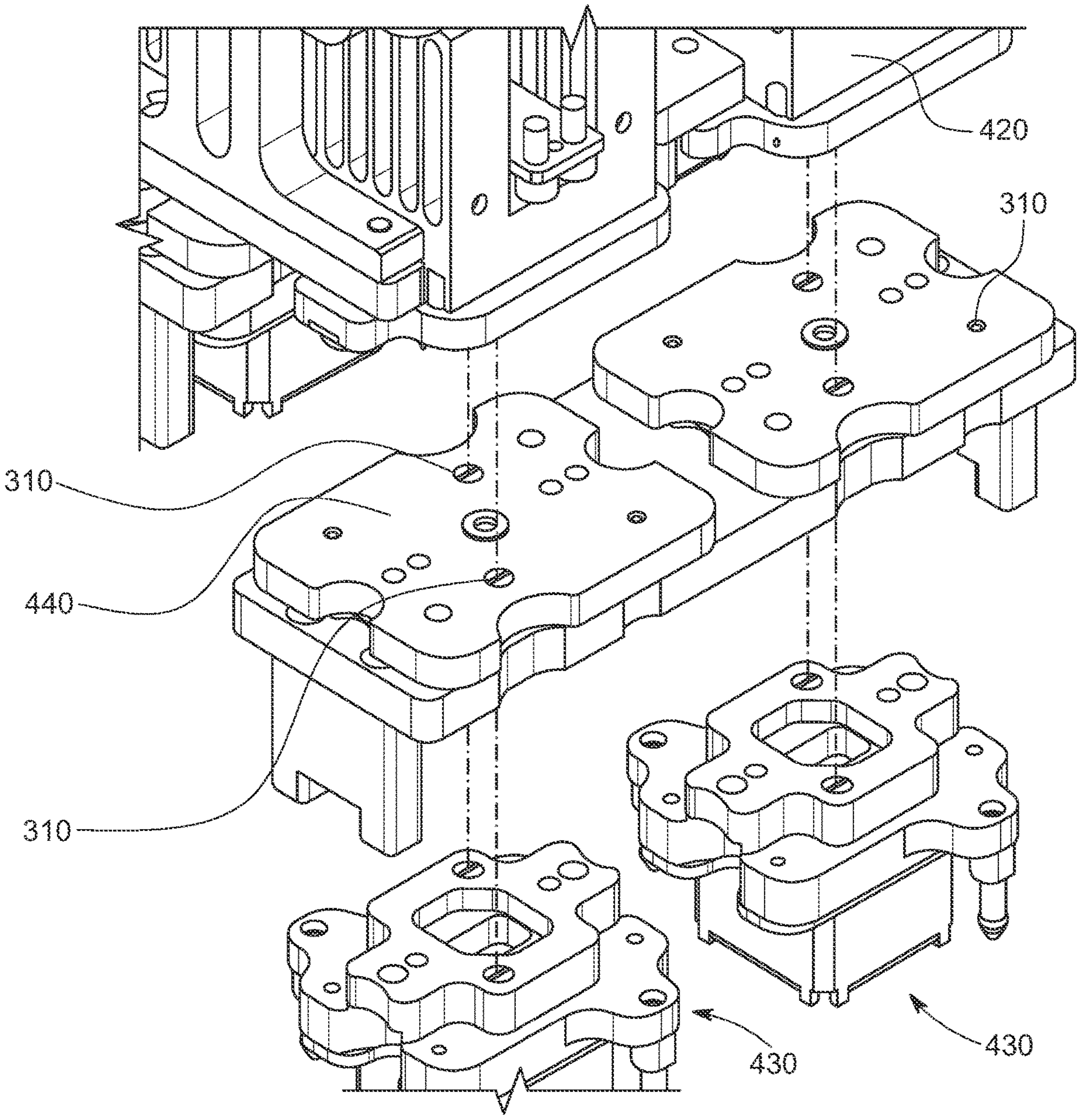

FIGS. 4A and 4B illustrate top isometric views of a magnetically retained replaceable contact plate assembly 300 in conjunction with a DUT layout unit ("DLU") 420 and a pair of contact chucks 430, in accordance with embodiments of the present invention. The contact plate assembly 300 couples the DLU 420 to the contact chucks 430. In some embodiments, contact chuck assembly 430 may retain and/or eject a DUT via vacuum action. Magnetically retained replaceable contact plate assembly 300 may comprise a vacuum port 440, configured to couple a vacuum and/or positive pressure from the DLU 420 to the contact chuck assembly 430.

In general, the contact chuck 430 comprises fine alignment features to register a device under test (DUT), e.g., a packaged semiconductor, with a socket on a test board (not shown). The magnetically retained replaceable contact plate assembly 300 provides some compliance between the DLU 420 and the contact chuck 430. For example, the contact chuck 430 may not be able move a DLU into alignment with a DUT. Further, multiple contact chucks 430 of a single DLU may require fine alignment adjustments that are incompatible with one another, e.g., that the single DLU cannot accommodate. For example, one contact chuck requires movement in a positive-X dimension, while a second contact chuck requires movement in a negative-X dimension. Accordingly, the magnetically retained replaceable contact plate assembly 300 provides compliance between the DLU 420 and the contact chuck 430, for example, to prevent binding during installation of the contact plate to the DLU and the contact chucks to the contact plate.

The contact chuck assembly 300 is typically specific to a DUT and/or type of DUT. Accordingly, the assembly 300 is typically changed for each type of DUT to be tested. For a test setup configured to test 16 DUTs, 32 fasteners 11 are utilized. Thus, under the conventional art, a changeover from a test system for a first DUT to test a second DUT requires removal of 32 fasteners 11, and insertions of 32 fasteners 11 in order to replace the contact plate. Typically, such fasteners must be accessed by hand from below the assembly 300 and DLU, in limited space.

Moreover, under the conventional art, the order of installation of contact chucks and/or contact plates to a DLU is very order specific. For example, a plurality of contact plates must be connected to a DLU (using tools in a limited space from below the DLU) prior to connecting contact chucks to a contact plate assembly.

Advantageously, in accordance with embodiments of the present invention, contact chucks, e.g., contact chucks 430 (FIG. 4A), may be attached to a magnetically retained replaceable contact plate assembly 300, in a first operation, e.g., in an open and accessible environment, and then the combined assembly (magnetically retained replaceable contact plate assembly 300 and contact chucks 430) may be attached to a DLU, e.g., DLU 420, as a sub assembly, without using tools.

Figure 5A:
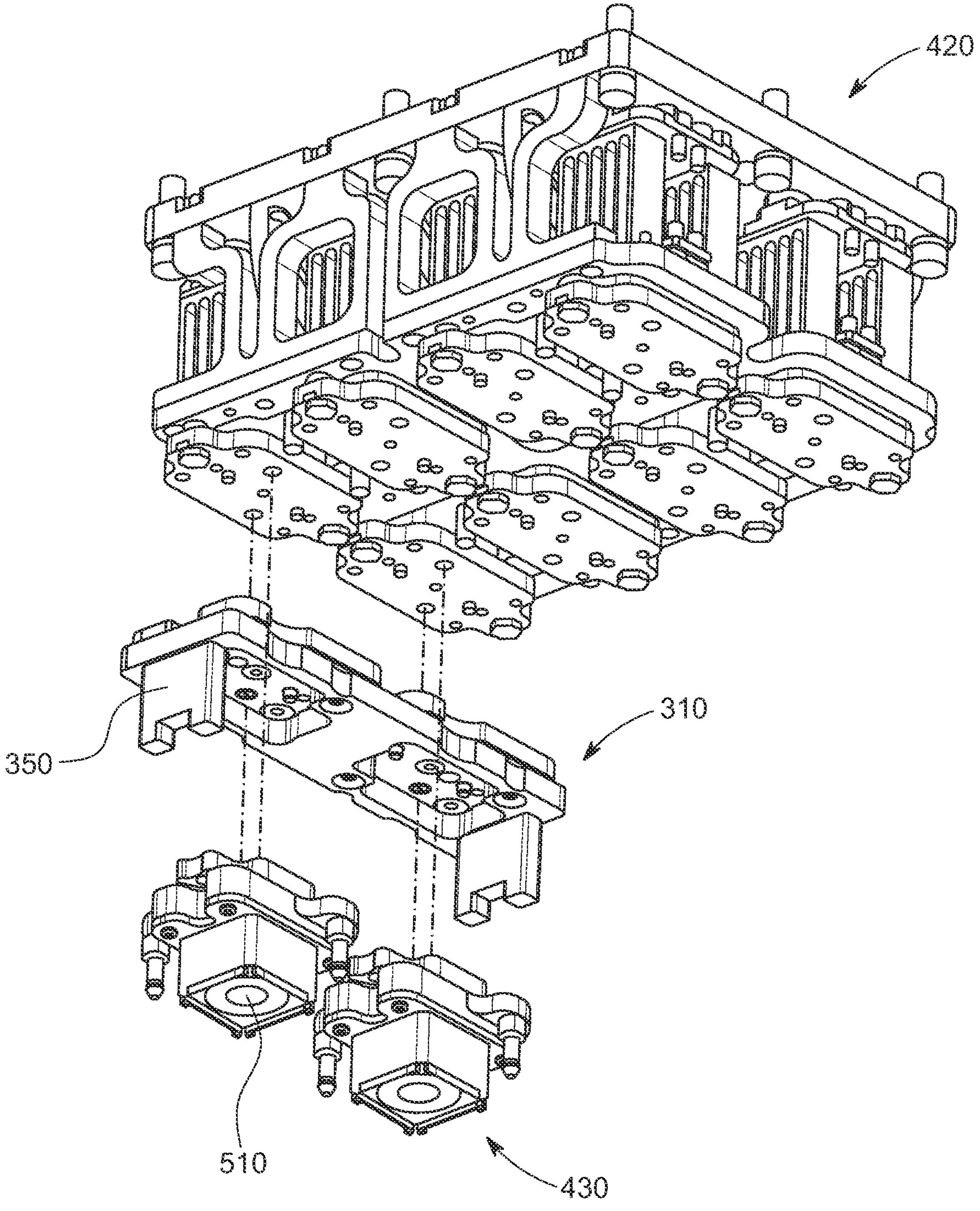
FIGS. 5A and 5B illustrate bottom isometric views of magnetically retained replaceable contact plate assembly in conjunction with a DUT layout unit ("DLU") and a pair of contact chucks, in accordance with embodiments of the present invention.
Figure 5A:
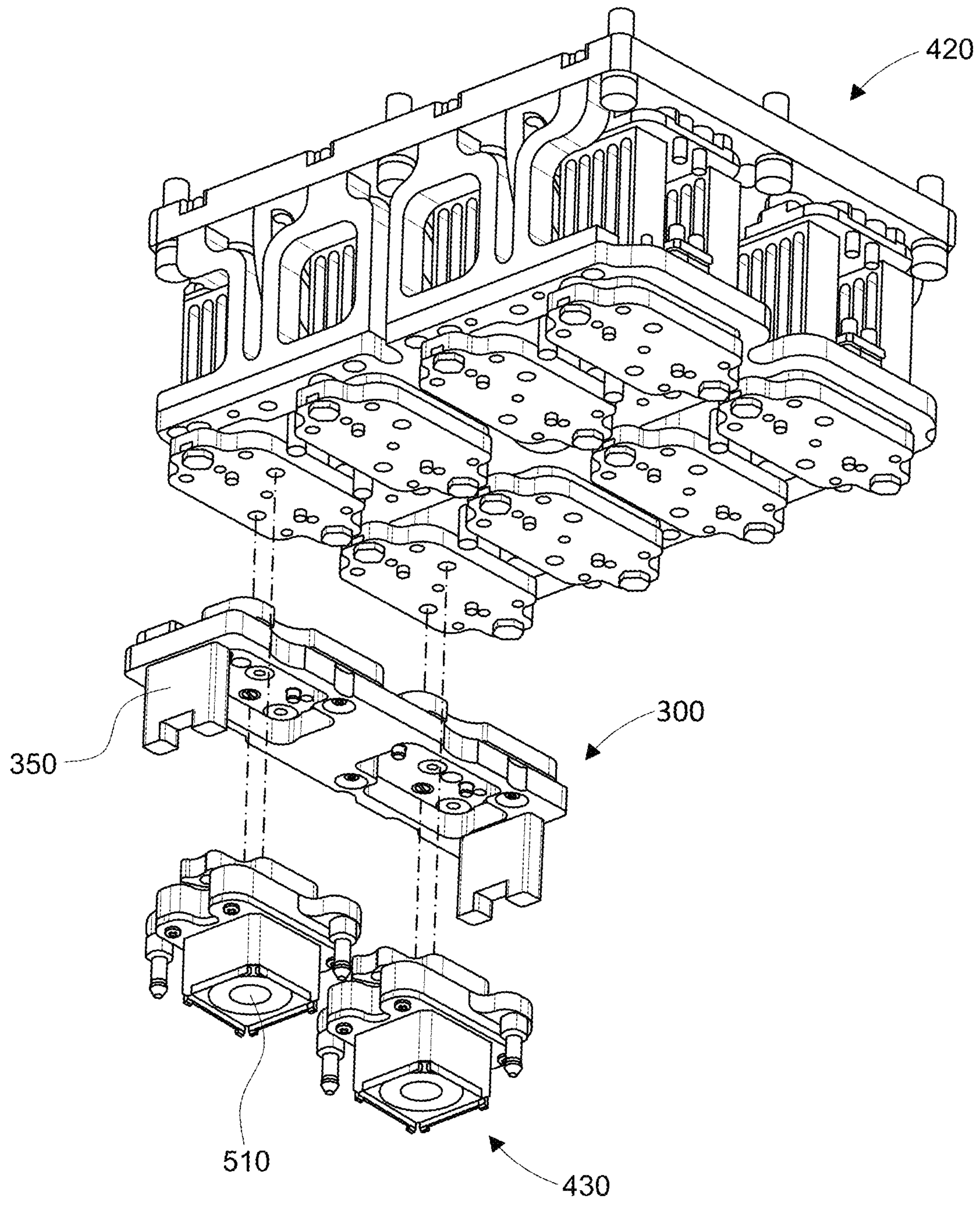
Figure 5B:
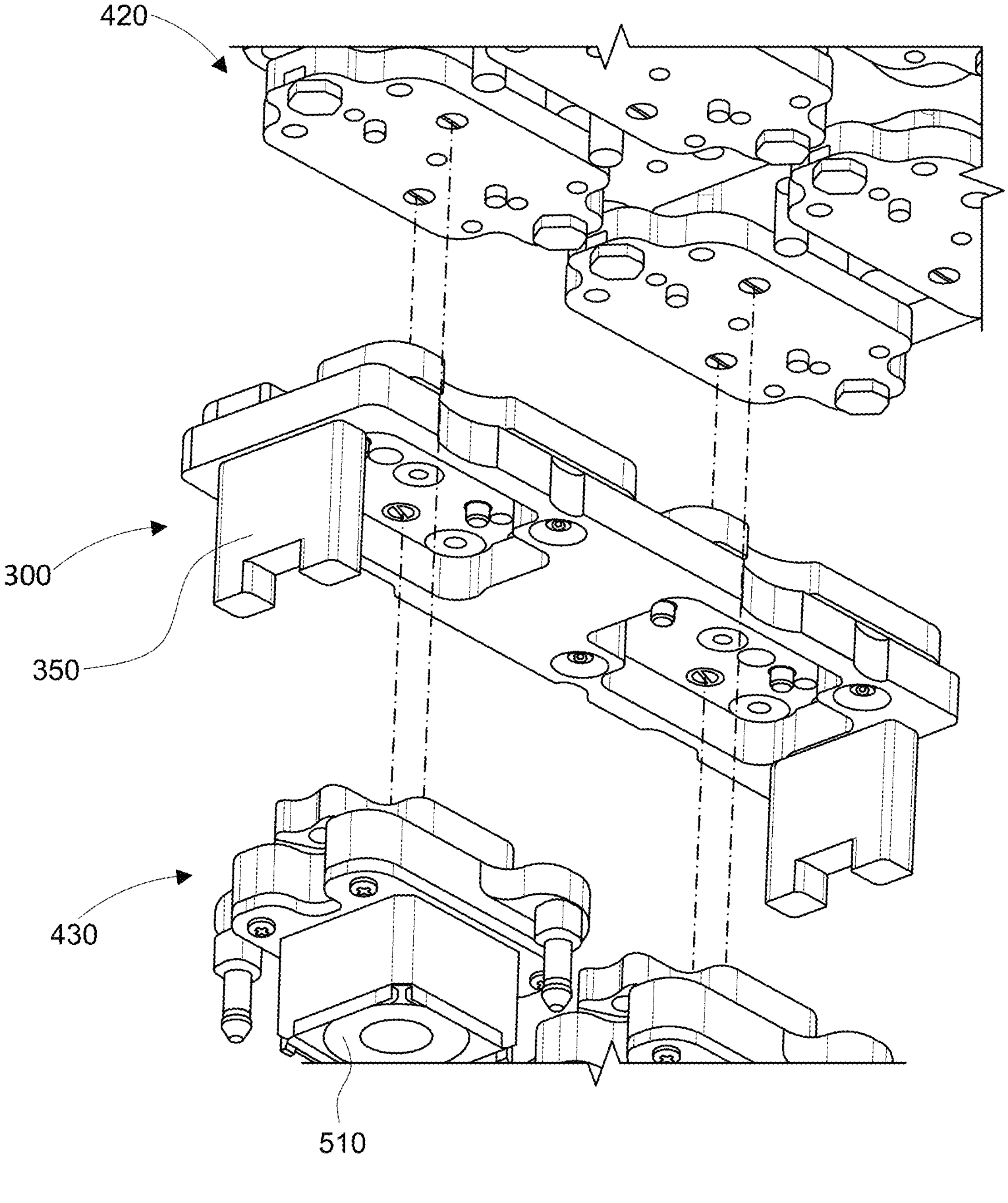

FIGS. 5A and 5B illustrate bottom isometric views of magnetically retained replaceable contact plate assembly 300 in conjunction with a DUT layout unit ("DLU") 420 and a pair of contact chucks 430, in accordance with embodiments of the present invention. FIGS. 5A and 5B also illustrate a device under test (DUT) interface 510. DUT interface 510 is configured to hold a device under test during transport, place a DUT into a socket and/or contactor, and remove the DUT from the socket/contactor. The DUT interface 510 may also hold a DUT in a socket/contractor during test, in some embodiments.

FIG. 6 illustrates a tester assembly 600, in accordance with embodiments of the present invention. Contact chuck 430 is attached to contact plate 310. Contac plate 310 is magnetically coupled to DUT layout unit ("DLU") 420. DUT layout unit ("DLU") 420 is attached to a test head 610. Test head 610 positions the DLU 420, Contract Plate 310, and Contact Chuck 430 in X, Y, and Z directions to place a test stack over a device under test ("DUT").

Various embodiments of the invention are thus described. While the present invention has been described in particular embodiments, it should be appreciated that the invention should not be construed as limited by such embodiments, but rather construed according to the below claims.

I claim:

1. A magnetically retained and removable contact plate assembly comprising:

a contact chuck configured to physically mate with a device under test (DUT);

one or more contact plates configured to physically mate with said contact chuck;

a DUT layout unit (DLU) configured to couple to said one or more contact plates and to couple to a semiconductor handler unit; and a plurality of magnets retained within said one or more contact plates and configured to removably attach to said DLU, wherein said plurality of magnets are further configured to align with a corresponding plurality of magnets of said DLU.

2. The contact plate assembly of claim 1 further comprising a hard stop plate configured to limit travel of said contact plate assembly in a direction toward said DUT.

3. A magnetically retained and removable contact plate assembly comprising:

a contact chuck configured to physically mate with a device under test (DUT); and a DUT layout unit (DLU), wherein said DLU is configured to couple to multiple magnetically retained replaceable contact plate assemblies and configured to couple to a semiconductor handler unit;

a vacuum port configured to pass a vacuum from said DLI to said contact chuck for retention of said DUT, and wherein said DLU is configured to position said DUT within a test environment, and wherein said magnetically retained replaceable contact plate assembly is configured to magnetically attach to said DLU.

4. The magnetically retained and removable contact plate assembly of claim 3 further configured to provide compliance between positioning of said contact chuck to said DLU.

5. The magnetically retained and removable contact plate assembly of claim 3 further configured to conduct thermal energy from said contact chuck to said DLU.

6. The magnetically retained and removable replaceable contact plate assembly of claim 3 further configured to be attached to said DLU without use of tools.

7. The magnetically retained and removable contact plate assembly of claim 3 further configured to apply a force to said contact chuck to retain said DUT in a socket.

8. A magnetically retained and removable contact plate assembly comprising:

a contact chuck configured to physically mate with a device under test (DUT);

a contact plate configured to physically mate with said contact chuck;

a DUT layout unit (DLU) configured to couple to multiple contact plates and to a semiconductor handler unit;

a first plurality of magnets retained within said contact chuck and configured to removably attach said contact chuck to said contact plate; and a second plurality of magnets retained within said contact plate and configured to removably attach said contact plate to said DLU.

9. The contact plate assembly of claim 8 wherein said first plurality of magnets are further configured to align with said second plurality of magnets.

* * * * *